United States Patent [19]
Anderson et al.

[11] Patent Number: 5,825,317
[45] Date of Patent: Oct. 20, 1998

[54] DIGITAL-TO-ANALOG CONVERTER AND METHOD OF CALIBRATING

[75] Inventors: David J. Anderson, Scottsdale; Robert M. Gardner; Jerald A. Hallmark, both of Gilbert, all of Ariz.

[73] Assignee: Motorola, Inc., Schaumburg, Ill.

[21] Appl. No.: 835,244

[22] Filed: Apr. 7, 1997

[51] Int. Cl.[6] .................................................. H03M 1/10
[52] U.S. Cl. .......................... 341/120; 341/118; 341/144; 341/133
[58] Field of Search .................................... 341/118, 120, 341/121, 133, 136, 144

[56] References Cited

U.S. PATENT DOCUMENTS 5,153,592  10/1992  Fairchild et al. ..................... 341/118
5,450,084   9/1995  Mercer .................................. 341/153
5,541,870   7/1996  Mihara et al. ......................... 365/145

OTHER PUBLICATIONS

"Bipolar and MOS Analog Integrated Circuit Design", Alan Grebene, John Wiley & Sons, Singapore, 1991, pp. 818–823.

Primary Examiner—Marc S. Hoff
Assistant Examiner—Jason L. W. Kost
Attorney, Agent, or Firm—Rennie William Dover; Robert D. Atkins

[57] ABSTRACT

A ferroelectric transistor (72) is programmed with a gate voltage that shifts a threshold voltage of the ferroelectric transistor (72). The shifted threshold voltage generates a correction current ($\Delta I_{(N-1)}$) in a combination circuit (52) that trims an output voltage of a DAC trim circuit (50). A ferroelectric material (32) of the ferroelectric transistor (72) stores a charge in accordance with a programming voltage and allows a dynamic adjustment of the correction current ($\Delta I_{(N-1)}$) that is used to modify the output voltage of the DAC trim circuit (50).

20 Claims, 3 Drawing Sheets

DIGITAL-TO-ANALOG CONVERTER AND METHOD OF CALIBRATING

BACKGROUND OF THE INVENTION

The present invention relates, in general, to integrated circuits and, more particularly, to digital-to-analog converters.

Electronic circuits such as cellular telephones, laptop computers, coders/decoders, and voltage regulators require an accurate voltage for effective operation. One technique for generating an accurate voltage is to use a circuit known as a digital-to-analog converter (DAC).

One method for generating an accurate voltage from a DAC is to use the current scaling of another DAC for self-corrected trimming. Transistors in current sources are appropriately sized to provide binary weighted currents that can be digitally switched onto a node and summed. The summed binary weighted currents are converted into an output voltage using an operational amplifier and feedback resistor.

The combination of a sized transistor together with either a fusible link or a programmable switch allows selection of the desired current that accurately sets the value of the DAC output voltage. The fusible link may be a metal segment or a Zener diode in series with the transistor. The destructive opening of the fusible link fixes the current generated by the DAC. The DAC can not dynamically respond to system voltage variations or semiconductor device burn-in changes to readjust the output voltage.

Programmable switches include complementary metal oxide semiconductor (CMOS) transmission gates, either an N-channel or P-channel MOSFETS, or bipolar transistors that are programmed to be either in an on-state or an off-state. Memory cells such as electrically programmable read only memory (EPROM) cells store the data that programs the switches. Although the programmable switches provide flexibility for modifying the output voltage of the DAC, the memory cells add additional processing cost and area cost to the integrated circuit.

Accordingly, it would be advantageous to have a circuit and method that provides reliable trimming of a DAC to generate the desired output voltage. It would be of further advantage to have a trimming circuit that provides dynamic correction to the DAC output voltage without increasing the cost of the integrated circuit.

DESCRIPTION OF THE PREFERRED EMBODIMENTS

Generally, the present invention provides a ferroelectric transistor and a method of programming the ferroelectric transistor with a gate voltage that shifts the threshold voltage. The shifted threshold voltage generates a correction current in a trimming circuit of a digital-to-analog converter (DAC) circuit that adjusts the total DAC output current to the desired value. The ferroelectric material of the ferroelectric transistor retains a polarization state in accordance with the programming voltage and allows dynamic adjustments to the correction current, which in turn adjusts the total DAC output current.

Figure 1:
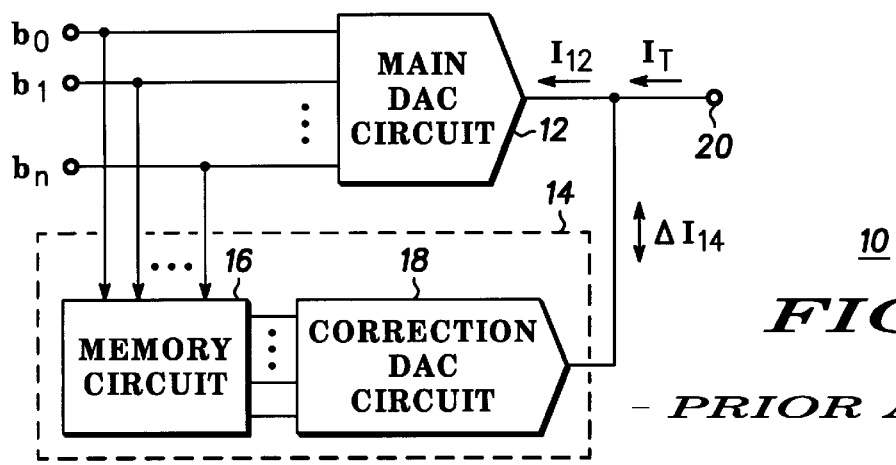
FIG. 1 is a block diagram of a prior art self-correcting DAC.

FIG. 1 is a block diagram of a prior art self-correcting DAC 10. Self-correcting DAC 10 includes a main DAC circuit 12 and a memory/correction DAC circuit 14. Main DAC circuit 12 and memory/correction DAC circuit 14 have inputs that are commonly connected and serve as the input terminals of self-correcting DAC 10. The input terminals are coupled for receiving an N-bit data word, where N is an integer. The data word $(b_{(N-1)}, b_{(N-2)}, \ldots b_1, b_0)$ has a word length of N, where $b_0$ is the least significant bit and $b_{(N-1)}$ is the most significant bit. An output of main DAC circuit 12 and an output of memory/correction DAC circuit 14 are commonly connected and form a node that serves as output terminal 20.

More particularly, memory/correction DAC circuit 14 includes a memory circuit 16 and a correction DAC circuit 18. Memory circuit 16 has inputs that serve as the inputs of memory/correction DAC circuit 14. In other words, the N-bit data word received at the inputs of self-correcting DAC 10 are also received at the inputs of memory circuit 16. In addition, the outputs of memory circuit 16 are connected to the inputs of correction DAC circuit 18. An output of correction DAC circuit 18 serves as the output of memory/correction DAC circuit 14.

In operation, main DAC circuit 12 converts the N-bit digital input into an output current $I_{12}$. A transimpedance amplifier (not shown) is connected to terminal 20 and is used to convert the current $I_{12}$ into a voltage. During calibration, the output voltage of the transimpedance amplifier is measured and compared to the desired output voltage. Correction data values are generated in accordance with the difference between the measured output voltage and the desired output voltage. The correction data values are stored in memory circuit 16. Thus, in the calibration mode the N-bit data word serves as both a binary data input to main DAC circuit 12 for generating the current $I_{12}$ and as an address to memory circuit 16 for storing correction data values.

At the completion of calibration, memory circuit 16 contains a correction data value for each of the N data words. When N has a value of eight, memory circuit 16 stores 256 correction data values for the 256 data words. For any of the 256 data word possibilities, self correcting DAC 10 supplies a current $I_T$ having a current $I_{12}$ supplied by main DAC circuit 12 and a current $\Delta I_{14}$ supplied by memory/correction DAC circuit 14. Because current $\Delta I_{14}$ may increase or decrease, the total current IT generated by self correcting DAC 10 is $I_{12} \pm \Delta I_{14}$. Current $I_T$ is equal to a current $I_{out}$ that is converted to an output voltage by the transimpedance amplifier.

Figure 2:
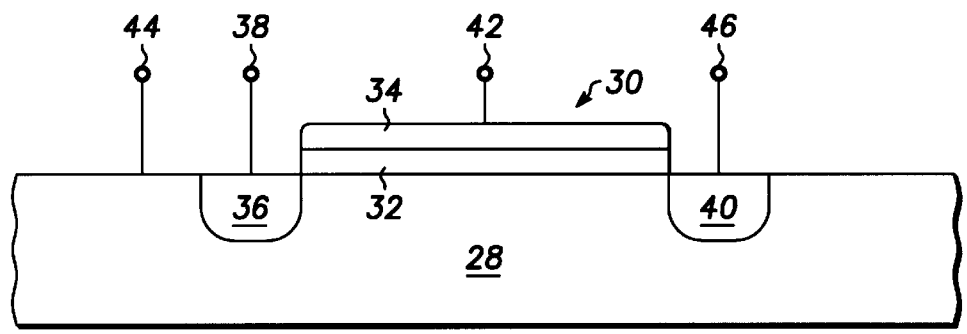
FIG. 2 is a cross-sectional view of a ferroelectric programmable transistor in accordance with the present invention.

FIG. 2 is a cross-sectional view of a ferroelectric transistor 26 in accordance with the present invention. Ferroelectric transistor 26 is comprised of a semiconductor material 28 having a gate structure 30 formed thereon. In accordance with one embodiment of the present invention, gate structure 30 is comprised of a ferroelectric material 32 and a conductive gate material 34, wherein ferroelectric material 32 is epitaxially grown on semiconductor material 28. Ferroelectric material 32 serves as a gate dielectric material of ferroelectric transistor 26. In addition, ferroelectric transistor 26 has source and drain regions 36 and 40, respectively. A source electrode 38 contacts source region 36, a drain electrode 46 contacts drain region 40, and a gate electrode 42 contacts gate material 34. A bulk or body terminal 44 contacts semiconductor material 28.

Ferroelectric transistors are also referred to as ferrogate devices or transistors. Although ferroelectric transistor 26 is shown as an N-channel Field Effect Transistor (FET) structure, it should be understood this is not a limitation of the present invention. In other words, ferroelectric transistor 26 can be a P-channel FET structure. Further, ferroelectric transistor 26 may be either an N-channel or a P-channel enhancement mode device or either an N-channel or a P-channel depletion mode device.

The threshold voltage, $V_{TH}$, of a non-ferroelectric Metal Oxide Semiconductor Field Effect Transistor (MOSFET) device is determined by the semiconductor material, the type of gate material, the impurities and fixed charge at the interface between the gate dielectric material and the semiconductor material, and the doping concentration of the bulk region of the semiconductor material and the composition and dimensions of the gate dielectric. In addition, threshold voltage, $V_{TH}$, is dependent on the potential between a source terminal and a bulk terminal. This effect is commonly referred to as body effect.

The threshold voltage, $V_{TH}$, of ferroelectric transistor 26 is shifted by supplying a programming voltage at gate electrode 42. The new threshold voltage resulting from the programmed threshold shift is held constant by ferroelectric material 32 when the programming voltage is removed. Thus, the non-volatile threshold shift allows ferroelectric transistor 26 to conduct current in a channel formed between drain region 40 and source region 36 in semiconductor material 28. Ferroelectric transistor 26 can be used either in an analog mode or a digital mode. When in the analog mode, the ferroelectric transistor typically operates in the active region of the transistor.

A positive programming voltage supplied at gate electrode 42 causes an N-channel ferroelectric FET structure to form a positive charge layer in a portion of the ferroelectric material adjacent the interface between ferroelectric material 32 and semiconductor material 28. The positive charge attracts electrons from a bulk portion of semiconductor material 28 to the portion of the semiconductor material between source region 36 and drain region 40. The electrons increase the conduction current in ferroelectric transistor 26 such that the current is higher than that of non-ferroelectric MOSFET devices.

A negative programming voltage supplied at gate electrode 42 generates negative charge in a portion of the ferroelectric material adjacent the interface between ferroelectric material 32 and semiconductor material 28. The negative charge attracts holes to the substrate surface that block channel formation such that the current is lower than that of non-ferroelectric MOSFET devices.

Figure 3:
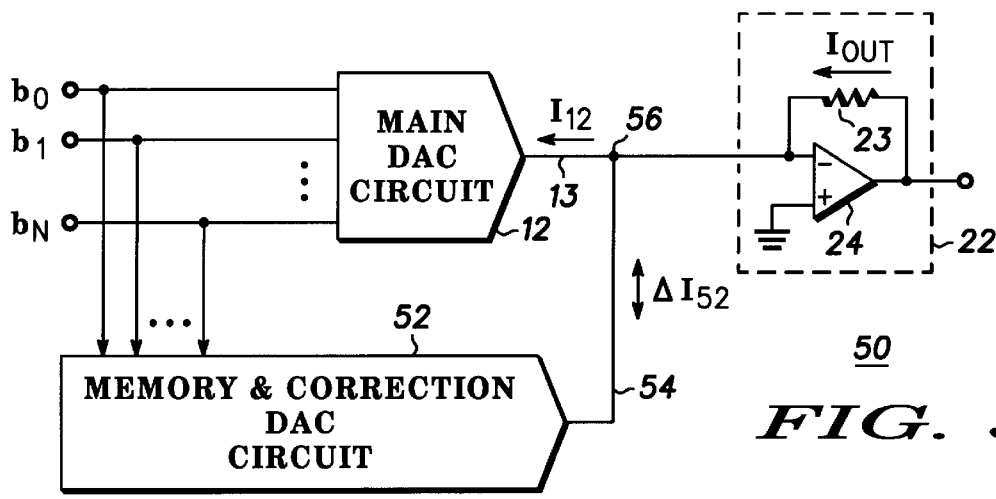
FIG. 3 is a block diagram of a DAC trim circuit in accordance with the present invention.

FIG. 3 is a block diagram of a DAC trim circuit 50 in accordance with the present invention. A DAC trim circuit 50 is also referred to as a digital-to-analog converter circuit. It should be noted that the same reference numbers are used in the figures to denote the same elements. The inputs of DAC trim circuit 50 are coupled for receiving an N-bit data word, where N is an integer. The data word having data bits $b_{(N-1)}$, $b_{(N-2)}$, ... $b_1$, $b_0$ has a word length of N, where $b_0$ is the least significant bit and $b_{(N-1)}$ is the most significant bit. In particular, DAC trim circuit 50 includes a main DAC circuit 12, a transimpedance circuit 22, and a memory and correction DAC circuit 52. Memory and correction DAC circuit 52 is also referred to as a combination circuit. The inputs of main DAC circuit 12 and the inputs of combination circuit 52 are commonly connected and serve as the inputs of DAC trim circuit 50. In other words, N connections for individual bits $b_{(N-1)}$–$b_0$ provide the electrical paths between main DAC circuit 12 and combination circuit 52 for receiving an N-bit data word.

Combination circuit 52 uses the ferroelectric properties of ferroelectric transistors. Thus, a memory circuit such as circuit 16 (shown in FIG. 1) is not needed. Each ferroelectric transistor stores a threshold voltage value used to adjust the current that either flows in or out of combination circuit 52. In addition, combination circuit 52 provides a current $\Delta I_{52}$ that is used for trimming a current $I_{12}$ generated by main DAC circuit 12.

Transimpedance circuit 22 includes a resistor 23 and an operational amplifier 24. Resistor 23 has one terminal connected to an output of operational amplifier 24 that also serves as the output of DAC trim circuit 50. The other terminal of resistor 23 is connected to the inverting input of operational amplifier 24 and serves as the input of transimpedance circuit 22. The non-inverting input of operational amplifier 24 is connected to a power supply terminal for receiving a voltage potential such as, for example, ground.

In addition, an output 13 of main DAC circuit 12 and an output 54 of combination circuit 52 are commonly connected and form a node 56. The input of transimpedance circuit 22 is connected to node 56. It should be noted that the number of inputs to main DAC circuit 12 and the number of inputs to combination circuit 52 preferably match the width of the N-bit data word received by DAC trim circuit 50. It should be further noted that the number of bits in the N-bit data word is not a limitation of the present invention.

Figure 4:
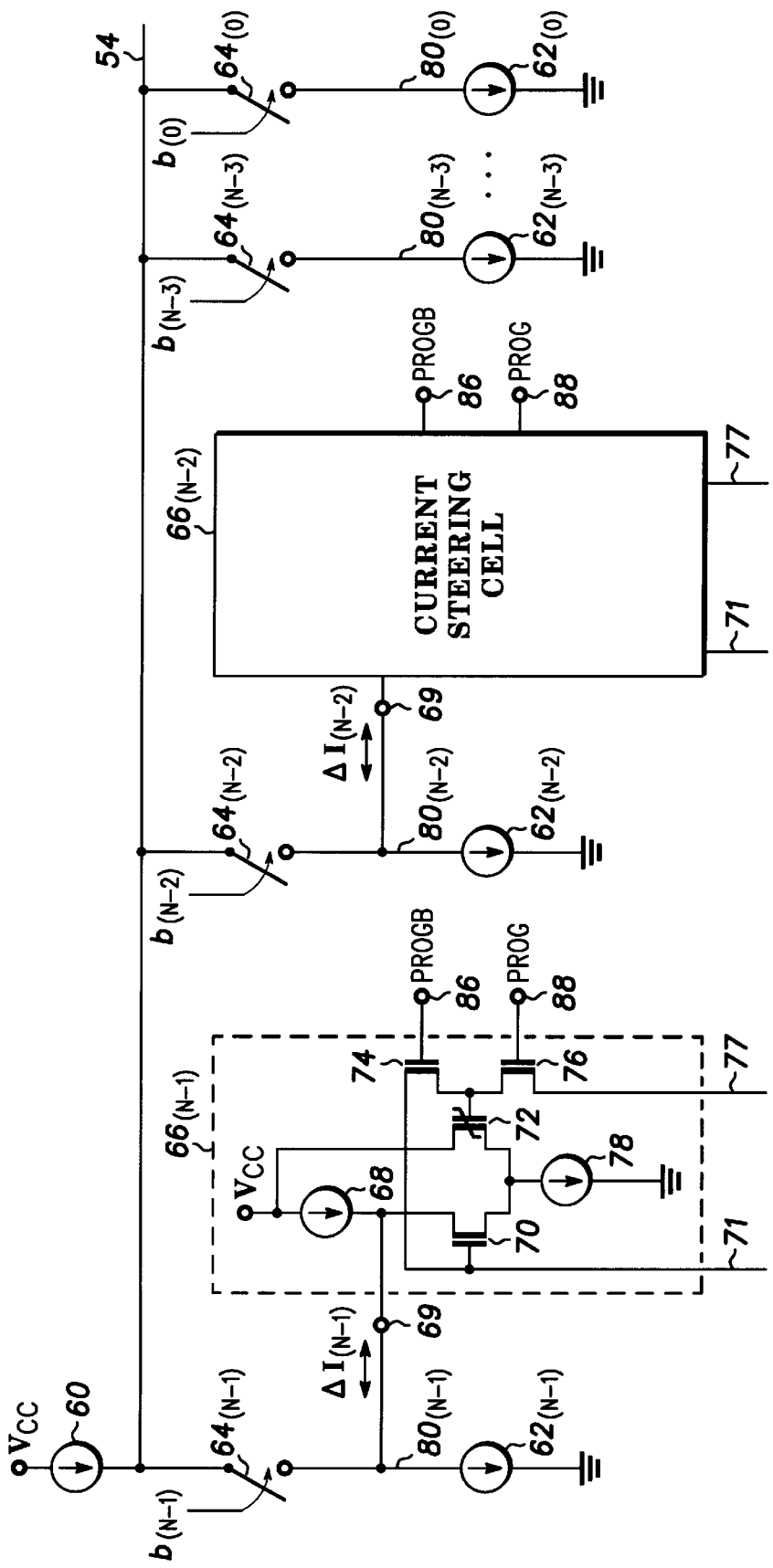
FIG. 4 is a schematic diagram of a memory and correction DAC circuit as shown in the block diagram of FIG. 3.

FIG. 4 is a schematic diagram of combination circuit 52 as shown in the block diagram of FIG. 3. Combination circuit 52 includes a current source 60, current sources $62_{(N-1)}$–$62_{(0)}$, switches $64_{(N-1)}$–$64_{(0)}$, and current steering circuits $66_{(N-1)}$–$66_{(N-2)}$. N is an integer number of data correction bits for combination circuit 52. Current source 60 and current sources $62_{(N-1)}$–$62_{(0)}$ each have two terminals. Switches $64_{(N-1)}$–$64_{(0)}$ are three terminal devices having a control terminal, and two current carrying terminals. Current steering circuit $66_{(N-1)}$ includes MOSFETs 70, 74, and 76, current sources 68 and 78, and a ferroelectric transistor 72. In particular, MOSFET 70 and ferroelectric transistor 72 are a differential transistor pair having commonly connected source terminals that also connect to an output terminal of current source 78. Another output terminal of current source 78 is connected to a power supply terminal for receiving an operating potential such as, for example, ground. The drain terminal of MOSFET 70 is connected to an output terminal of current source 68 and serves as terminal 69 of current steering circuit $66_{(N-1)}$. Another output terminal of current source 68 is commonly connected to a drain terminal of ferroelectric transistor 72 and to a power supply terminal for receiving an operating potential such as, for example, Vcc. The gate terminal of ferroelectric transistor 72 is commonly connected to the drain terminals of MOSFETs 74 and 76. The gate terminals of MOSFETs 74 and 76 serve as inputs 86 and 88 of current steering circuit $66_{(N-1)}$, respectively. The source terminal of MOSFET 74 is connected to the gate terminal of MOSFET 70 and serves as an input 71 of current steering circuit $66_{(N-1)}$. The source terminal of MOSFET 76 serves as an input 77 of current steering circuit $66_{(N-1)}$. It should be noted that MOSFETs 74 and 76 are referred to as programming transistors and a signal received at input 77 is referred to as a programming signal.

In addition, current source $62_{(N-1)}$ has an input terminal connected to a power supply terminal for receiving an operating potential such as, for example, ground. Another input terminal of current source $62_{(N-1)}$ is commonly connected to one current terminal of switch $64_{(N-1)}$ and to terminal 69 of current steering circuit $66_{(N-1)}$. The control terminal of switch $64_{(N-1)}$ is connected to an input for receiving the signal $b_{(N-)}$, i.e., the most significant bit of the data word. Another current terminal of switch $64_{(N-1)}$ is commonly connected to a terminal of current source 60 and to a current terminal of each of switches $64_{(N-2)}$–$64_{(0)}$, the common connection serves as output 54 of combination circuit 52.

Current steering cell $66_{(N-2)}$ has inputs 86 and 88 that are coupled for receiving inputs PROGB and PROG, respectively. It should be noted that the signal PROGB is the complementary digital value of the signal PROG. Input 71 is coupled for receiving a bias voltage and input 77 is coupled for receiving a programming voltage. Terminal 69 of current steering cell $66_{(N-2)}$ is commonly connected to one terminal of current source $62_{(N-2)}$ and to one current terminal of switch $64_{(N-2)}$. The control terminal of switch $64_{(N-2)}$ is coupled for receiving the binary data bit $b_{(N-2)}$. The other current terminal of switch $64_{(N-2)}$ is connected to a power supply terminal that receives an operating potential such as, for example, ground.

The other current terminal of switch $64_{(N-3)}$ is connected to a terminal of current source $62_{(N-3)}$. The control terminal of switch $64_{(N-3)}$ is connected to an input for receiving a signal such as, for example, $b_{(N-3)}$. The other current terminal of switch $64_{(0)}$, is connected to a terminal of current source $62_{(0)}$. The control terminal of switch $64_{(0)}$ is connected to an input for receiving a signal such as, for example, $b_0$. Each of the other terminals for current sources $62_{(N-3)}$–$62_{(0)}$ are connected to a power supply terminal that receives an operating potential such as, for example, ground.

Only two current steering circuits have been included for illustrative purposes. It should be noted that the number of current steering circuits in combination circuit 52 is not a limitation of the present invention. It should be further noted that not all of the serially connected current source and switch combinations are shown. It should be understood that current sources $62_{(N-1)}$–$62_{(0)}$ are binary weighted. In other words, current source $62_{(N-1)}$ supplies a current $I_{max}/2$, current source $62_{(N-2)}$ supplies a current $I_{max}/4$, current source $62_{(N-3)}$ supplies a current $I_{max}/8$, etc., where the current $I_{max}$ is the sum of the currents supplied by current sources $62_{(N-1)}$–$62_{(0)}$ Current source 60 supplies a current $I_{max}/4$.

In operation, ferroelectric transistor 72 is programmed by supplying a logic one signal to input 88 and a logic zero signal to input 86 of current steering circuits $66_{(N-1)}$–$66_{(N-2)}$. The programming voltage value supplied at input 77 is transferred to the gate terminal of ferroelectric transistors 72 in the respective current steering circuits $66_{(N-1)}$ and $66_{(N-2)}$. The threshold voltage of ferroelectric transistor 72 in current steering circuits $66_{(N-1)}$ and $66_{(N-2)}$ is shifted in accordance with the value of the programming voltage. It should be noted that the programming voltage received at input 77 of current steering circuits $66_{(N-1)}$ and $66_{(N-2)}$ may or may not have different values. After programming the threshold voltage values of ferroelectric transistors 72, a logic one value of the signal PROGB and a logic zero value of the signal PROG are supplied to inputs 86 and 88, respectively. The shifted threshold voltage of ferroelectric transistor 72 in current steering circuits $66_{(N-1)}$ and $66_{(N-2)}$ remains unchanged after programming.

The logic one value of the signal PROGB at input 86 allows the voltage value at the gate terminal of ferroelectric transistor 72 to be about the same as the voltage value at the gate of MOSFET 70, i.e., the voltage value as received at input 71. The voltage at input 71 is a bias voltage that has, for example, a voltage of about Vcc/2.

By way of example, when MOSFET 70 and ferroelectric transistor 72 have been programmed to have similar threshold voltage values, both transistors have substantially the same drain-source currents $I_{68}$. Current source 68 supplies a current $I_{68}$ and current source 78 sinks a current that is approximately twice the value of $I_{68}$, i.e., ($2*I_{68}$). In other words, the current $I_{68}$ supplied by current source 68 flows through MOSFET 70 and an additional current $I_{68}$ supplied by Vcc flows through ferroelectric transistor 72. The current of MOSFET 70 and the current of ferroelectric transistor 72 are combined at the common transistor source terminals. The combined current $2*I_{68}$ flows into current source 78. Current source 78 can sink a current of $2*I_{68}$ and therefore, current does not flow in or out of current steering circuit $66_{(N-1)}$. Accordingly, the current $\Delta I_{(N-1)}$ at terminal 69 is zero.

When ferroelectric transistor 72 is programmed with a threshold voltage that is greater than the threshold voltage value of MOSFET 70, ferroelectric transistor 72 has a drain-source current that is less than current $I_{68}$, as denoted by a deficiency current having a value of $\Delta I_{(N-1)}$. A current flows into current steering circuit $66_{(N-1)}$ at terminal 69 and through MOSFET 70 to add a deficiency current that brings the combined current of MOSFET 70 and ferroelectric transistor 72 to a value of $2*I_{68}$. It should be noted that when switch $64_{(N-1)}$ is closed and ferroelectric transistor 72 is programmed to have a high threshold voltage value, the output voltage of transimpedance amplifier 22 increases as current Iout increases. The amount by which Iout increases is the amount of the deficiency current $\Delta I_{(N-1)}$.

On the other hand, when ferroelectric transistor 72 is programmed to have a threshold voltage value that is less than the threshold voltage value of MOSFET 70, ferroelectric transistor 72 has a drain-source current that is greater than $I_{68}$, as denoted by an excess current having a value of $\Delta I_{(N-1)}$. A current flows out of current steering circuit $66_{(N-1)}$ at terminal 69 and subtracts an excess current that brings the combined current of MOSFET 70 and ferroelectric transistor 72 to a value of $2*I_{68}$. It should be noted that when switch $64_{(N-1)}$ is closed and ferroelectric transistor 72 is programmed to have a low threshold voltage value, the output voltage of transimpedance amplifier 22 decreases in accordance with the decrease in the current Iout, i.e., the amount of the excess current $\Delta I_{(N-1)}$.

In a similar fashion, when switch $64_{(N-2)}$ is closed and ferroelectric transistor 72 is programmed with a threshold voltage that is greater than the threshold voltage value of MOSFET 70 in current steering cell $66_{(N-2)}$ ferroelectric transistor 72 has a drain-source current that is less than current $I_{68}$, as denoted by a deficiency current having a value of $\Delta I_{(N-2)}$. On the other hand, when ferroelectric transistor 72 is programmed to have a threshold voltage value that is less than the threshold voltage value of MOSFET 70, ferroelectric transistor 72 has a drain-source current that is greater than $I_{68}$, as denoted by an excess current having a value of $\Delta I_{(N-1)}$. It should be noted that binary weighting causes the current $\Delta I_{(N-1)}$ from current steering cell $66_{(N-1)}$ to have a greater affect on the output voltage of transimpedance amplifier 22 than the current $\Delta I_{(N-2)}$ from current steering cell 66$_{(N-2)}$.

Switches 64$_{(N-3)}$–64$_{(0)}$ are open and closed by signals $b_{(N-3)}$–$b_0$, respectively. When switches 64$_{(N-3)}$–64$_{(0)}$ are closed, the respective current sources 62$_{(N-3)}$–62$_{(0)}$ sink a current that causes an increase in the magnitude of current $\Delta I_{52}$ from correction circuit 52. The current $\Delta I_{52}$ is used in trimming the current $I_{12}$ of main DAC circuit 12.

The programming voltage supplied at input 77 is set to supply a current $\Delta I_{52}$ from combination circuit 52. In other words, for a given data word having data bits $b_{(N-1)}$–$b_0$, main DAC circuit 12 supplies a current of $I_{12}$ and combination circuit 52 supplies a current of $\Delta I_{52}$. The current $\Delta I_{52}$ is the sum of the currents ($\Delta I_{(N-1)} + \Delta I_{(N-2)} \ldots + \Delta I_0$). The current $I_{12}$ is added to current $\Delta I_{52}$ and transmitted to transimpedance circuit 22 to provide an output voltage that may have a value that is more or less than a desired voltage value. The output voltage of transimpedance circuit 22 is adjusted to the desired voltage value by changing the current $\Delta I_{52}$ that is supplied from correction circuit 52. For instance, the output voltage is raised by increasing the value of current $\Delta I_{52}$. By supplying a lower programming voltage at input 77, the threshold voltage value of ferroelectric transistor 72 is shifted to a higher value. It should be noted that when the output voltage of DAC trim circuit 50 supplies the desired voltage value for a data word, the current $I_{out}$ flowing through resistor 23 has a value of ($I_{12} + \Delta I_{52}$). Thus, the correction current $\Delta I_{52}$ can be determined and correlated to a programming voltage that is supplied at input 77.

Figure 5:
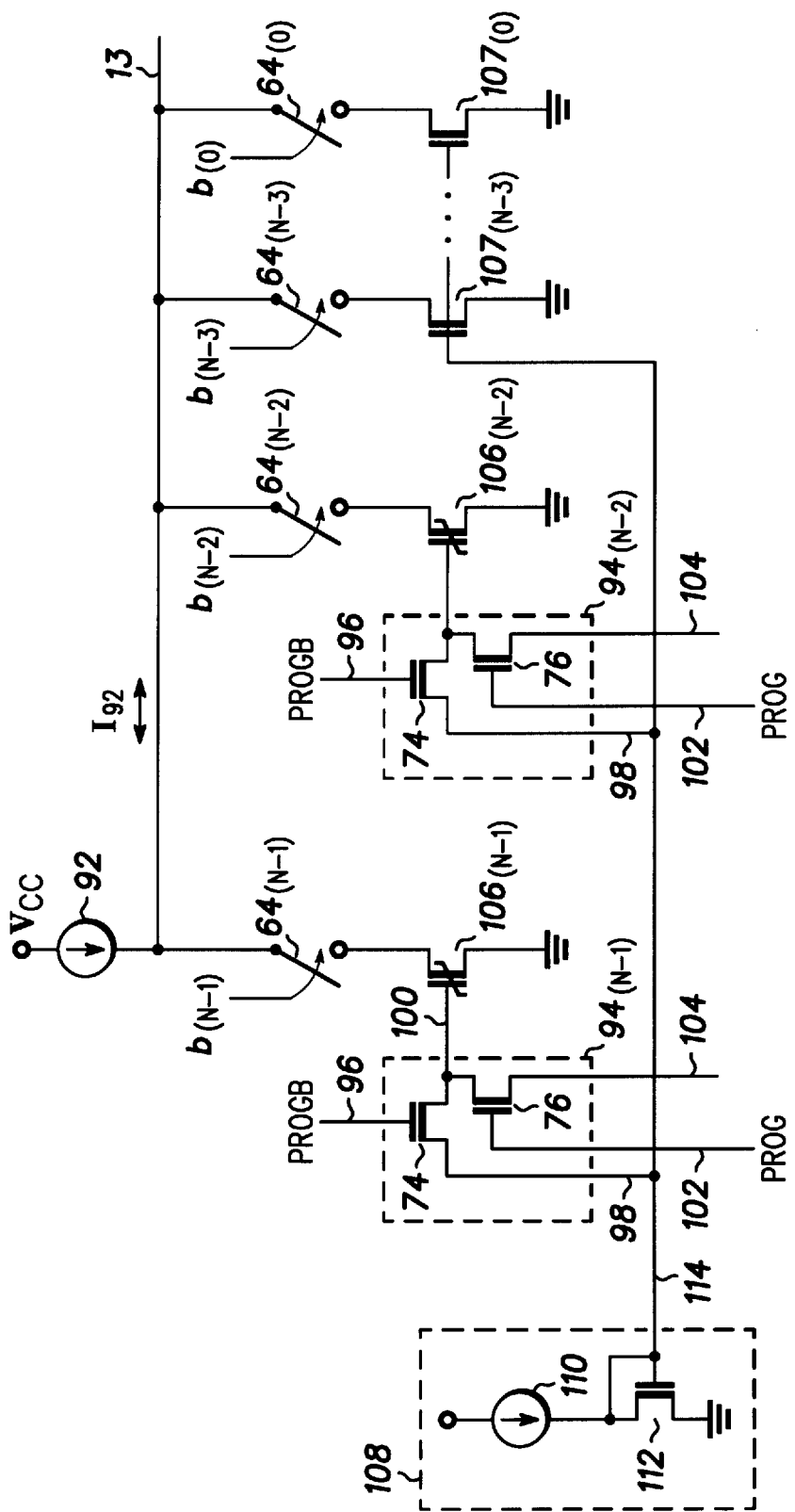
FIG. 5 is a schematic diagram of another embodiment of the present invention which incorporates the ferroelectric transistor as part of the main DAC circuit.

FIG. 5 is a schematic diagram of another embodiment of the present invention which incorporates the ferroelectric transistor as part of main DAC circuit 90. Main DAC circuit 90 includes a current source 92, switches 64$_{(N-1)}$–64$_{(0)}$, programming circuits 94$_{(N-1)}$ and 94$_{(N-2)}$, ferroelectric transistors 106$_{(N-1)}$, 106$_{(N-2)}$, transistors 107$_{(N-3)}$–107$_{(0)}$, and bias circuit 108. Programming circuits such as 94$_{(N-1)}$ and 94$_{(N-2)}$ include MOSFETs 74 and 76. MOSFETs 74 and 76 each have a gate terminal, a drain terminal, and a source terminal. In particular, the source terminal of MOSFETs 74 and 76 serve as inputs 98 and 104, respectively. The gate terminals of MOSFETs 74 and 76 serve as respective inputs 96 and 102. Inputs 96 and 102 are coupled for receiving input signals such as, for example, PROGB and PROG, respectively. The drain terminals of MOSFETs 74 and 76 are commonly connected to each other and form a node that serves as output 100 of programming circuits 94$_{(N-1)}$ and 94$_{(N-2)}$.

Bias circuit 108 is comprised of a current source 110 and a MOSFET 112. In particular, a gate terminal of MOSFET 112 is commonly connected to a drain terminal of MOSFET 112 and to an output terminal of current source 110, the commonly connected node serving as output 114 of bias circuit 108. It should be noted that the signal at output 114 is referred to as a bias reference voltage. An input terminal of current source 110 is connected to a power supply terminal that is coupled for receiving an operating voltage such as, for example, Vcc. The source terminal of MOSFET 112 is connected to a power supply terminal that is coupled for receiving an operating voltage such as, for example, ground.

Current source 92 has an input terminal connected to a power supply terminal that is coupled for receiving an operating voltage such as, for example, Vcc. An output terminal of current source 92 and a current terminal for each of switches 64$_{(N-1)}$–6$_{(0)}$ are commonly connected and serve as output 13 of main DAC circuit 90. The signals $b_{(-1)}$–$b_0$ are inputs to the control terminal of switches 64$_{(N-1)}$–64$_{(0)}$, respectively. Another current terminal of switch 64$_{(N-1)}$ is connected to the drain terminal of ferroelectric transistor 106$_{(N-1)}$. A gate terminal of ferroelectric transistor 106$_{(N-1)}$ is connected to output 100 of programming circuit 94$_{(N-1)}$. The source terminal of ferroelectric transistor 106$_{(N-1)}$ is connected to a power supply terminal that is coupled for receiving an operating voltage such as, for example, ground.

Another current terminal of switch 64$_{(N-2)}$ is connected to the drain terminal of ferroelectric transistor 106$_{(N-2)}$. A gate terminal of ferroelectric transistor 106$_{(N-2)}$ is connected to output 100 of programming circuit 94$_{(N-2)}$. The source terminal of ferroelectric transistor 106$_{(N-2)}$ is connected to a power supply terminal that is coupled for receiving an operating voltage such as, for example, ground.

Input 98 of programming circuits 94$_{(N-1)}$ and 94$_{(N-2)}$ and the gate terminals of MOSFETs 107$_{(N-3)}$–107$_{(0)}$ are commonly connected to output 114 of bias circuit 108. Input 102 of programming circuits 94$_{(N-1)}$ and 94$_{(N-2)}$ are coupled for receiving programming voltages that shift the threshold voltage values of ferroelectric transistor 72.

Programming circuits 94$_{(N-1)}$ and 94$_{(N-2)}$ have been included for illustrative purposes. It should be noted that the number of programming circuits is not a limitation of the present invention. It should be further noted that ferroelectric transistors 106$_{(N-1)}$ and 106$_{(N-2)}$, and MOSFETs 107$_{(N-3)}$–107$_{(0)}$ are binary weighted transistors. Ferroelectric transistors 106$_{(N-1)}$ and 106$_{(N-2)}$, as well as MOSFETs 107$_{(N-3)}$–107$_{(0)}$, each have a gate structure that includes a width W and a length L that are sized in accordance with providing binary weighted currents. In other words, ferroelectric transistors 106$_{(N-1)}$ and 106$_{(N-2)}$ supply currents $I_{max}/2$ and $I_{max}/4$, respectively, and MOSFETs 107$_{(N-3)}$–107$_{(0)}$ supply currents $I_{max}/8$ to $I_{max}/256$, where the current $I_{max}$ is the sum of the currents supplied by ferroelectric transistors 106$_{(N-1)}$ and 106$_{(N-2)}$ MOSFETs 107$_{(N-3)}$–107$_{(0)}$, when N has a value of eight. By way of example, binary weighting between MOSFET 107$_{(N-3)}$ and MOSFET 107$_{(N-4)}$ is provide by sizing the gate structure for both transistors as having a common length of L, but the width of the gate structure of MOSFET 107$_{(N-3)}$ is sized to have two times the width of the gate structure for MOSFET 107$_{(N-4)}$. Current source 92 supplies a current $I_{max}/4$.

In operation, main DAC circuit 90 generates the current $I_{12}$ that is supplied at output 13 and is converted to a voltage by transimpedance circuit 22. The memory and correction DAC circuit 52 (see FIG. 3) are eliminated by main DAC circuit 90. In other words, main DAC circuit 90 provides an equivalent of both a current $I_{12}$ and a delta current.

Ferroelectric transistors 106$_{(N-1)}$ and 106$_{(N-2)}$ are programmed by supplying a logic one signal to input 102 and a logic zero signal to input 96 of programming circuits 94$_{(N-1)}$ and 94$_{(N-2)}$. The programming voltage value supplied at input 104 of programming circuits 94$_{(N-1)}$ and 94$_{(N-2)}$ are passed to the gate terminals of the respective ferroelectric transistors 106$_{(N-1)}$ and 106$_{(N-2)}$. The threshold voltages of ferroelectric transistors 106$_{(N-1)}$ and 106$_{(N-2)}$ are shifted in accordance with the programming voltage values. It should be noted that the programming voltages received at input 104 of programming circuits 94$_{(N-1)}$ and 94$_{(N-2)}$ may or may not have different values. After programming the threshold voltage values for ferroelectric transistors 106$_{(N-1)}$ and 106$_{(N-2)}$, a logic one value of the signal PROGB and a logic zero value of the signal PROG are supplied to inputs 96 and 102, respectively. The shifted threshold voltages for ferroelectric transistors $106_{(N-1)}$ and $106_{(N-2)}$ are retained after programming.

MOSFET 112 in bias circuit 108 is selected to match the size of ferroelectric transistor $106_{(N-1)}$ MOSFET 112 and ferroelectric transistor $106_{(N-1)}$ form a current mirror such that the bias supplied at output 114 has a voltage value of about Vcc/2. The current sourced to ground from current source 92 depends on switches $64_{(N-1)}$–$64_{(0)}$ that are closed, the binary weighting of ferroelectric transistors $106_{(N-1)}$–$106_{(N-2)}$ and MOSFETs $107_{(N-3)}$–$107_{(0)}$, and the value of the programming threshold voltages for ferroelectric transistors $106_{(N-1)}$ and $106_{(N-2)}$.

The data value for binary bits $b_{(N-1)}$–$b_0$ causes switches $64_{(N-1)}$–$64_{(0)}$ to be opened or closed. For any of switches $64_{(N-1)}$–$64_{(0)}$ that are closed, a binary weighted portion of the total current $I_{92}$ from current source 92 is directed to ground through either a ferroelectric transistor or a MOSFET. In other words, when switch $64_{(0)}$ is closed, a current of $I_{92}/256$ is directed to ground through MOSFET $107_{(0)}$. For any of switches $64_{(N-1)}$–$64_{(0)}$ that are open, that portion of binary weighted current that is directed to ground when the switch is closed is redirected to output 13. By programming either ferroelectic transistor $106_{(N-1)}$ or $106_{(N-2)}$, the threshold voltage for that transistor is shifted. For example, when the threshold voltage of ferroelectric transistor $106_{(N-1)}$ is shifted to a lower value, an additional portion of the current $I_{92}$ is directed to ground. When the threshold voltage of ferroelectric transistor $106_{(N-1)}$ is shifted to a higher value, less of the total current $I_{92}$ from current source 92 is directed to ground and a greater portion is available at output 13. Thus, an output voltage of a transimpedance circuit connected to output 13 (not shown) can be corrected in accordance with programming voltage values for ferroelectric transistors $106_{(N-1)}$ and $106_{(N-2)}$.

By now it should be appreciated that a structure and method have been provided that allows reliable trimming of a DAC to generate the desired output voltage. The trimming circuit for the present invention eliminates a memory circuit that contains corrective values and thereby decreases the cost of the integrated circuit. The present invention provides a circuit where programming voltages shift the threshold voltage of a ferroelectric transistor and dynamically correct a DAC output voltage.

We claim:

1. A digital-to-analog converter circuit, comprising:
   a differential transistor pair, wherein a first transistor of the differential transistor pair has a drain terminal, a source terminal, a gate terminal, and a first threshold voltage value and a second transistor of the differential transistor pair has a drain terminal, a source terminal, a gate terminal, and is a ferroelectric transistor having a second threshold voltage value, the second threshold voltage value being programmable and the source terminals of the first and second transistors being commonly coupled; and
   a first current source having a first terminal coupled to the commonly coupled source terminals of the first and second transistors.

2. The digital-to-analog converter circuit of claim 1, further comprising a second current source having a first terminal coupled to the drain terminal of the first transistor and a second terminal commonly coupled to a drain terminal of the second transistor and to a power supply terminal.

3. The digital-to-analog converter circuit of claim 2, further comprising:
   a first programming transistor having a gate terminal, a source terminal, and a drain terminal; and
   a second programming transistor having a gate terminal, a source terminal, and a drain terminal, wherein the drain terminal of the second programming transistor is coupled to the drain terminal of the first programming transistor and to the gate terminal of the second transistor of the differential transistor pair.

4. The digital-to-analog converter circuit of claim 3, wherein the source terminal of the first programming transistor is coupled to the gate terminal of the first transistor of the differential transistor pair.

5. The digital-to-analog converter circuit of claim 4, wherein the source terminal of the second programming transistor is coupled for receiving a programming voltage value, and wherein the programming voltage value shifts the second threshold voltage value of the second transistor of the differential transistor pair.

6. The digital-to-analog converter circuit of claim 5, further comprising:
   a switch having a first terminal and a second terminal, and
   a third current source having a first terminal coupled to the drain terminal of the first transistor of the differential transistor pair and to the first terminal of the switch.

7. The digital-to-analog converter circuit of claim 6, wherein the first transistor of the differential transistor pair is a metal oxide semiconductor field effect transistor.

8. A method for calibrating a digital-to-analog converter (DAC), comprising the steps of:
   providing a first current as an output from a DAC in response to a data word; and
   switching a first delta current in response to the data word to sum with the first current and thereby calibrate the DAC, wherein the first delta current is set by programming a ferroelectric transistor with a first programming voltage that adjusts a threshold voltage value of the ferroelectric transistor operating in the active mode.

9. The method of claim 8, further comprising the step of programming the ferroelectric transistor with a second programming voltage that increases the threshold voltage value of the ferroelectric transistor and subtracts a second delta current from the first current.

10. The method of claim 8, further including operating the ferroelectric transistor in an analog mode, and wherein decreasing the threshold voltage value of the ferroelectric transistor includes programming the ferroelectric transistor.

11. The method of claim 8, further including operating the ferroelectric transistor in an analog mode, and wherein increasing the threshold voltage value of the ferroelectric transistor includes programming the ferroelectric transistor.

12. The method of claim 8, further comprising the step of configuring at least one transistor of a differential transistor pair to be the ferroelectric transistor.

13. A current steering circuit, comprising:
   a ferroelectric transistor operating in the active region and having a threshold voltage that is adjusted by a programming voltage;
   a first transistor that transfers the programming voltage received at a first conduction terminal to a gate terminal of the ferroelectric transistor when a gate terminal of the first transistor receives a programming signal; and
   a second transistor that transfers a signal received at a first conduction terminal to the gate terminal of the ferroelectric transistor when a gate terminal of the second transistor receives a complemented programming signal.

14. The current steering circuit of claim 13, wherein the first and second transistors are N-channel metal oxide semiconductor field effect transistors (MOSFETs).

15. The current steering circuit of claim 13, further including a third transistor having a first conduction terminal coupled to a first conduction terminal of the ferroelectric transistor, wherein the third transistor and the ferroelectric transistor form a differential transistor pair.

16. A differential transistor pair, comprising:

a first transistor of the differential transistor pair having a fixed threshold voltage value; and a second transistor of the differential transistor pair having a conduction terminal coupled to the conduction terminal of the first transistor, wherein the second transistor has an adjustable threshold voltage value that can be programmed by a programming voltage supplied to a gate terminal of the second transistor.

17. The differential transistor pair of claim 16, wherein the second transistor of the differential transistor pair is a ferroelectric transistor.

18. The differential transistor pair of claim 16, further comprising:

a third transistor that transfers the programming voltage received at a first conduction terminal to the gate terminal of the second transistor when a gate terminal of the third transistor receives a programming signal; and a fourth transistor that transfers a signal received at a first conduction terminal to the gate terminal of the second transistor when a gate terminal of the fourth transistor receives a complemented programming signal.

19. A current supply circuit, comprising:

a first current source;

a first transistor having a gate coupled for receiving a bias voltage, and a drain coupled to an output of the first current source and providing an output of the current supply circuit;

a ferroelectric transistor having a drain terminal coupled to a first power supply terminal;

a second current source having an output coupled to common source terminals of the first transistor and the ferroelectric transistor;

a second transistor having a source terminal coupled for receiving a programming voltage, and a gate terminal coupled for receiving a first programming signal; and a third transistor having a drain terminal coupled to a drain terminal of the second transistor and to a gate terminal of the ferroelectric transistor, a source terminal coupled for receiving the bias voltage, and a gate terminal coupled for receiving a complementary programming signal.

20. The current supply circuit of claim 19, further comprising:

a switch having a first terminal coupled to the output of the current supply circuit, a second terminal coupled to the drain terminal of the first transistor, and a control terminal coupled for receiving a control signal; and a third current source having an output coupled to the second terminal of the switch.

\* \* \* \* \*